(12) United States Patent
Fan et al.

(10) Patent No.: US 10,607,532 B2
(45) Date of Patent: Mar. 31, 2020

(54) DISPLAY MODULE, AND METHOD FOR FABRICATING THE SAME

(71) Applicants: Beijing BOE Optoelectronics Technology Co., Ltd., Beijing (CN); BOE Technology Group Co., Ltd., Beijing (CN)

(72) Inventors: Zhiqiang Fan, Beijing (CN); Ming Zhai, Beijing (CN); Xiaoliang Fu, Beijing (CN); Yuxiao Ge, Beijing (CN); Yawen Zhang, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/047,762

(22) Filed: Jul. 27, 2018

(65) Prior Publication Data

US 2019/0206304 A1 Jul. 4, 2019

(30) Foreign Application Priority Data

Jan. 2, 2018 (CN) .......................... 2018 1 0003081

(51) Int. Cl.
*G09G 3/22* (2006.01)
*G02B 6/42* (2006.01)
*H05K 1/18* (2006.01)
*F21V 8/00* (2006.01)

(52) U.S. Cl.
CPC ............. *G09G 3/22* (2013.01); *G02B 6/0083* (2013.01); *G02B 6/4239* (2013.01); *H05K 1/189* (2013.01); *G02B 6/009* (2013.01)

(58) Field of Classification Search
CPC ........................................................ G09G 3/22
See application file for complete search history.

(56) References Cited

U.S. PATENT DOCUMENTS

2016/0349444 A1* 12/2016 Robinson ............. G02B 6/0055
2017/0315404 A1* 11/2017 Ye ..................... G02F 1/133603

FOREIGN PATENT DOCUMENTS

| CN | 202421666 U | 9/2012 |
| CN | 105044981 A | 11/2015 |
| CN | 205405018 U | 7/2016 |
| CN | 107272260 A | 10/2017 |

OTHER PUBLICATIONS

Chinese First Office Action, dated Aug. 2, 2019, Application No. 201810003081.9.

* cited by examiner

*Primary Examiner* — Gustavo Polo
(74) *Attorney, Agent, or Firm* — Arent Fox LLP; Michael Fainberg

(57) ABSTRACT

The disclosure relates to the field of display technologies, and discloses a display module, and a method for fabricating the same, and the display module includes a display panel, a backlight module, and a flexible printed circuit, wherein the flexible printed circuit is electrically connected with the display panel, the backlight module includes a light source, and the light source is fixed on a side of the flexible printed circuit facing the display panel, and electrically connected with the flexible printed circuit.

11 Claims, 3 Drawing Sheets

DISPLAY MODULE, AND METHOD FOR FABRICATING THE SAME

CROSS-REFERENCE TO RELATED APPLICATION

This application claims priority of Chinese Patent Application No. 201810003081.9, filed on Jan. 2, 2018, which is hereby incorporated by reference in its entirety.

FIELD

The present disclosure relates to the field of display technologies, and particularly to a display module, and a method for fabricating the same.

BACKGROUND

In the field of display technologies, a display module has been widely applied due to its characteristics of a low weight, a small thickness, low power consumption, and high contrast, and is generally not only used as a display of a desktop computer, a portable computer, and a wall-installed TV set, but also used as a display screen of a mobile phone. Bezels with different sizes are arranged on the peripheries of the display screens in the majority of the existing display modules in the market, and display modules including large display areas with narrow bezels and without any bezels have been increasingly favored by various panel manufacturers and display terminal manufacturers due to their aesthetically pleasing and fashionable appearances.

SUMMARY

The embodiments of the disclosure provide the following technical solutions.

An embodiment of the disclosure provides a display module including a display panel, a backlight module, and a flexible printed circuit, wherein the flexible printed circuit is electrically connected with the display panel, the backlight module includes a light source, and the light source is fixed on a side of the flexible printed circuit facing the display panel, and electrically connected with the flexible printed circuit.

Optionally, the light source is soldered on the surface of the flexible printed circuit facing the display panel.

Optionally, the display module further includes an IC fixed on a surface of the flexible printed circuit away from the display panel, and electrically connected with the flexible printed circuit.

Optionally, the backlight module further includes a light-guiding plate, a light exit face of the light source is opposite to a light incidence face of the light-guiding plate, and the light-guiding plate is fixed between a surface of the flexible printed circuit and a surface of the display panel; these surfaces are opposite to each other.

Optionally, the light-guiding plate is fixed on the display panel through a first light-shielding adhesive tape.

Optionally, the first light-shielding adhesive tape covers the light-guiding plate, and a first white screen-printed layer is arranged on a side facing the light source, of a portion of the light-shielding adhesive tape; the portion is beyond the light-guiding plate.

Optionally, the flexible printed circuit is fixed on the surface of the light-guiding plate away from the display panel through a second light-shielding adhesive tape, and a second white screen-printed layer is arranged on the side of the second light-shielding adhesive tape facing the flexible printed circuit.

Optionally, the backlight module further includes a reflecting sheet, fixed on the side of the light-guiding plate away from the display panel, and partially covered with the flexible printed circuit.

Optionally, the light source is a COB light source.

Optionally, the flexible printed circuit is configured to power the display panel and the light source.

Furthermore an embodiment of the disclosure further provides a method for fabricating the display module according to any one of the technical solutions above, the method including the steps of:

fixing the light source on the surface of the flexible printed circuit facing the display panel, and electrically connecting the light source with the flexible printed circuit;

binding the flexible printed circuit with the display panel, and assembling them together with the backlight module; and bending and bonding the flexible printed circuit on the surface of the backlight module away from the display panel so that a light exit face of the light source is opposite to a light incidence face of the light-guiding plate.

Optionally, an alignment mark is arranged on a reflecting sheet of the backlight module for the purpose of alignment while the flexible printed circuit is being bonded on the surface of the backlight module away from the display panel.

DETAILED DESCRIPTION OF THE EMBODIMENTS

At present, a traditional display module includes a display panel and a backlight module, and the backlight module includes Light-Emitting Diodes (LEDs), where the LEDs are firstly soldered onto a lamp strip Flexible Printed Circuit (FPC), and the lamp strip FPC is further soldered with a main FPC, and powered by the main FPC to lighten the LEDs. A sufficient space shall be reserved in this structure to accommodate the lamp strip FPC, and to provide an adhesive tape with a sufficient adhesion area, so the bezel cannot be made narrow, but we have a growing demand for mobile phones with narrow bezels as the industry of mobile phones is advancing, so it is gradually difficult for the structure of the traditional display module to satisfy this demand. Accordingly it is highly desirable to provide a display module with a narrow bezel.

The technical solutions according to the embodiments of the disclosure will be described below clearly and fully with reference to the drawings in the embodiments of the disclosure, and apparently the embodiments to be described are only a part but not all of the embodiments of the disclosure. Based upon the embodiments here of the disclosure, all the other embodiments which can occur to those ordinarily skilled in the art without any inventive effort shall fall into the scope of the disclosure.

Figure 1:
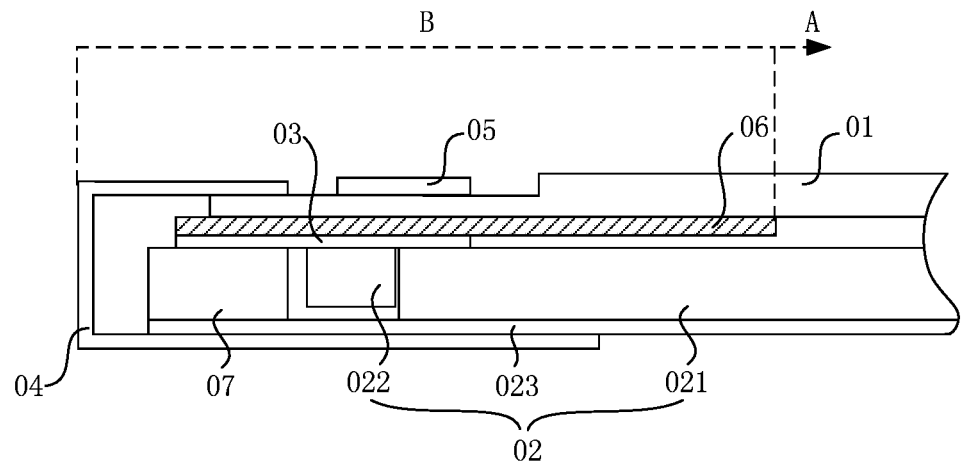
FIG. 1 is a schematic structural diagram of the display module in the related art.

As illustrated in FIG. 1, the display module in the related art includes a display panel 01, and a backlight module 02 arranged below the display panel 01 to provide the display panel 01 with backlight, a display area A and a non-display area B are arranged on the display panel 01, an IC (Integrated Circuit) 05 is arranged on the display panel 01, and the display panel 01 controls light rays emitted by the backlight module 02 to thereby display an image in the display area A. The backlight module 02 generally includes a light-guiding plate 021, a plurality of LED lamps 022, and a reflecting sheet 023, and the light-guiding plate 021 converts a point light source emitted by each LED lamp 022 into a planar light source, where the LED lamps 022 are firstly soldered onto a lamp strip Flexible Printed Circuit (FPC) 03, and the lamp strip FPC 03 is further soldered with a main Flexible Printed Circuit (FPC) 04; and at this time, the lamp strip FPC can be powered by the main FPC to thereby lighten the LED lamps 022. The display panel 01 is bonded with the backlight module 02 using an adhesive tape 06, and fixed therewith using an adhesive frame 07, and since a sufficient space shall be reserved in this structure to accommodate the lamp strip FPC 03, and to provide the adhesive tape 06 with a sufficient adhesion area, the size of the non-display area B is so large that a bezel cannot be made narrow.

Figure 2:
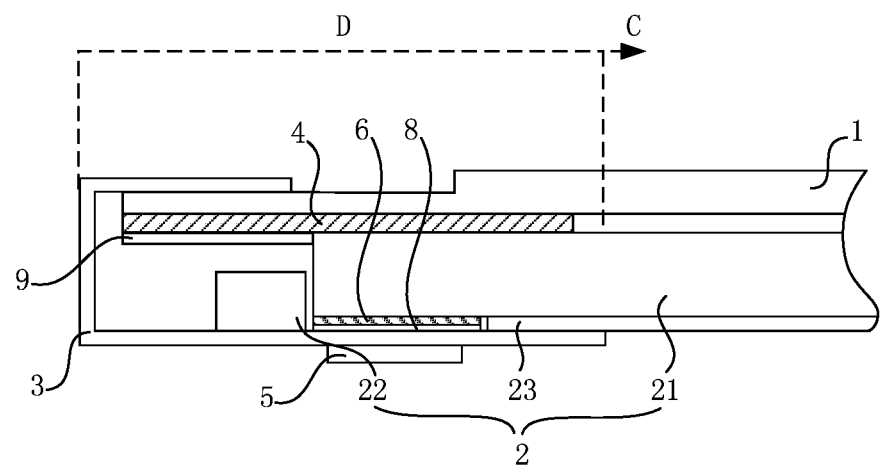
FIG. 2 is a schematic structural diagram of a display module according to an embodiment of the disclosure.

As illustrated in FIG. 2, an embodiment of the disclosure provides a display module including a display panel 1, a backlight module 2, and a flexible printed circuit 3, the flexible printed circuit 3 is electrically connected with the display panel 1, the backlight module 2 includes a light source 22, and the light source 22 is fixed on the side of the flexible printed circuit 3 facing the display panel 1, and electrically connected with the flexible printed circuit 3.

Figure 5:
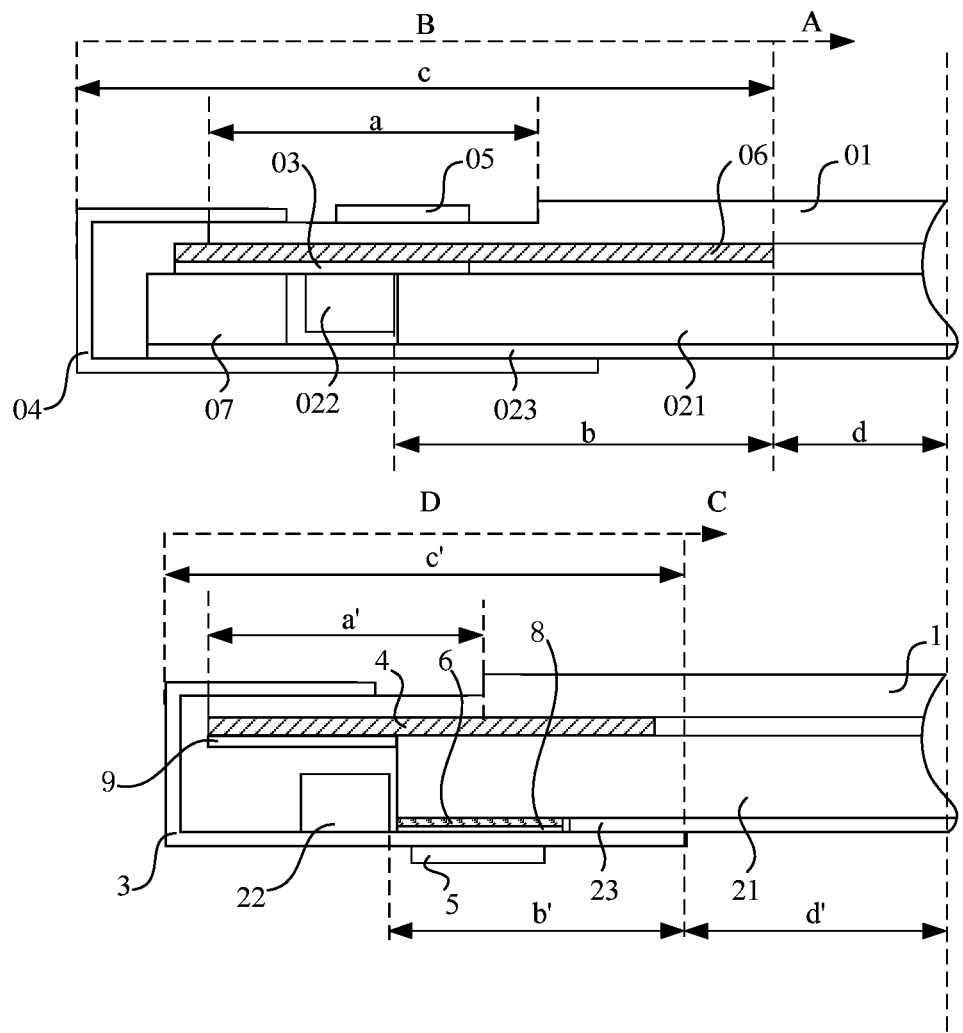
FIG. 5 is a schematic diagram of comparison between the display module according to the embodiment of the disclosure, and the display module in the related art.

In the display module above, since the light source 22 is fixed on the side of the flexible printed circuit 3 facing the display panel 1, and electrically connected with the flexible printed circuit 3, and the flexible printed circuit 3 is electrically connected with the display panel 1, that is, the light source 22 contacts directly with the flexible printed circuit 3, and is electrically connected with the flexible printed circuit 3, the flexible printed circuit 3 powers directly the display panel 1 and the light source 22, optionally, the flexible printed circuit 3 includes a circuit for supplying display driving signals to the display panel 1 and a circuit for supplying backlight driving signals to the light source 22; and as compared with the technical solution of the display module in the related art, with reference to the center of the display module as illustrated in FIG. 5, on one hand, the light source 22 is arranged on the side of the flexible printed circuit 3 facing the display panel 1, so that the distance b' between a light exit face of the bent light source 22 and a display area C is shorter than the distance b between the light exit face of the light source 022 and the display area A, so the size of a non-display area D can be reduced, and also the lamp strip FPC 03 and the adhesive tape 06 are dispensed with, so the size of the non-display area D can be further reduced, and thus the width c' of the non-display area D of the display module above can be made significantly less than the width c of the non-display area B of the display module in the related art, thus increasing the size of the display area C. in this way, the width d' of the display area C of the display module above is made significantly greater than the width d of the display area A of the display module in the related art to thereby provide the display module with a narrow bezel. On the other hand, the lamp strip flexible printed circuit 03 is dispensed with, and the light source 22 is powered directly by the flexible printed circuit 03 to thereby dispense with a process of soldering the lamp strip so as to further simplify the structure of the backlight module 2, thus simplifying the structure of the display module as a whole.

Further to the display module above, in order to enable the light source 22 to be fixed on the side of the flexible printed circuit 3 facing the display panel 1, and electrically connected with the flexible printed circuit 3, the light source 22 is soldered on the surface of the flexible printed circuit 3 facing the display panel 1 in an optional implementation.

In the display module above, a soldering process is a process of joining metal or other materials together through heating, processing at high temperature or high pressure, etc., so that the light source 22 can be electrically connected with the flexible printed circuit 3 simply and conveniently by having the surface of the light source 22 contact directly with the surface of the flexible printed circuit 3, and soldering and connecting them together so that the light source 22 is powered directly by the flexible printed circuit 3.

There are various forms of soldering, including laser soldering, ultrasonic soldering, or another satisfactory form of soldering, and the particular form of soldering can be selected for a real particular implementation of the display module, and in the display module above, the light source 22 can be electrically connected with the flexible printed circuit 3 simply and conveniently through ultrasonic soldering due to the good electrical conductivity of the assembly into which they are soldered, a less strict requirement on a metal surface to be soldered, a short period of time for soldering, and other advantages thereof.

Furthermore in order to electrically connect the light source 22 with the flexible printed circuit 3, they can be electrically connected otherwise instead of being soldered. The light source 22 can be electrically connected with the flexible printed circuit 3 in such a way that depends upon a real implementation of the display module.

Further to the display module above, in order to further reduce the size of the bezel of the display module so as to narrow the bezel, the display module further includes an IC 5 fixed on the surface of the flexible printed circuit 3 away from the display panel 1, and electrically connected with the flexible printed circuit 3, in an optional implementation as illustrated in FIG. 2.

In the display module the IC 5 is fixed on the surface of the flexible printed circuit 3 away from the display panel 1, and electrically connected with the flexible printed circuit 3, so that the IC 5 is arranged on the flexible printed circuit 3, and as compared with the technical solution of the display module in the related art, as illustrated in FIG. 5, the IC 5 in the display module is arranged on the surface of the flexible printed circuit 3 away from the display panel 1, and an area required for arranging the IC 05 is dispensed with in the display panel 1 as compared with the display panel 01 in the display module in the related art, so that the size a' on the display panel 1 is less than the size a on the display panel 01 in the display module in the related art, that is, the size of the non-display area D can be further reduced, so that the width c' of the non-display area D in the display module above can be can be made significantly less than the width c of the non-display area B in the display module in the related art, thus further reducing the width of the bezel so as to narrow the bezel of the display module.

The IC 5 can be soldered directly on the surface of the flexible printed circuit 3 away from the display panel 1, or can contact directly, and can be electrically connected, with the flexible printed circuit 3 through another IC 5. The IC 5 can be electrically connected with the flexible printed circuit 3 in such a way that depends upon a real implementation of the display module.

Further to the display module above, in order to further reduce the size of the bezel of the display module while guaranteeing a light effect of the backlight module 2, the backlight module 2 further includes a light-guiding plate 21, a light exit face of the light source 22 is opposite to a light incidence face of the light-guiding plate 21, and the light-guiding plate 21 is fixed between facing surfaces of the flexible printed circuit 3 and the display panel 1, in an optional implementation as illustrated in FIG. 2.

In the display module above, the light exit face of the light source 22 is arranged opposite to the light incidence face of the light-guiding plate 21, so that as many light rays emitted by the light source 22 as possible can enter the light-guiding plate 21 through the light incidence face to thereby increase the brightness of the planar light source produced by the light-guiding plate 21 so as to alleviate a loss of the light rays, thus guaranteeing the light effect of the display module 2; and the light-guiding plate 21 is fixed between the facing surfaces of the flexible printed circuit 3 and the display panel 1, so that the backlight module 2 is arranged fixed with the display module, and as compared with the display module in the related art, the backlight module 2 and the display module are not fixed using any adhesive frame, so that a corresponding component of the adhesive frame at the light source 22 can be dispensed with to thereby further reduce the size of the bezel of the display module so as to narrow the bezel.

In order to further reduce the bezel of the display module while the light-guiding plate 21 is fixed with the display panel, optionally the light-guiding plate 21 can be fixed on the display panel 1 through a first light-shielding adhesive tape 4 as illustrated in FIG. 2.

In the display module above, the first light-shielding adhesive tape 4 is connected together with the display module 1; and on one hand, the first light-shielding adhesive tape 4 fixes and connects the light-guiding plate 21 with the display panel 1, and on the other hand, the first light-shielding adhesive tape 4 can also shield and absorb the light rays to thereby alleviate a loss of the light rays so as to guarantee the light effect of the backlight module 2. Furthermore the light-guiding plate 21 and the display panel 1 can alternatively be connected through another structure to the same effect as described above.

Since the bent flexible printed circuit 3, and the first light-shielding adhesive tape 4 can shield and absorb the light rays, the corresponding component of the adhesive frame at the light source 22 can be dispensed with to thereby further reduce the size of the bezel of the display module so as to narrow the bezel.

In order to further alleviate a loss of the light rays, optionally the first light-shielding adhesive tape 4 covers the light-guiding plate 21, and a first white screen-printed layer 9 is arranged on the side, of the component of the light-shielding adhesive tape 4 beyond the light-guiding plate 21, facing the light source 22, as illustrated in FIG. 2.

In the display module above, the first white screen-printed layer 9 is arranged on the side, of the component of the light-shielding adhesive tape 4 beyond the light-guiding plate 21, facing the light source 22, so that the light rays, emitted by the light source 22, incident on the component of the light-shielding adhesive tape 4 beyond the light-guiding plate 21 can be reflected by the first white screen-printed layer 9 back to the light source 22 side, that is, the first white screen-printed layer 9 will only reflect but not absorb the light rays emitted by the light source 22, so that as many light rays emitted by the light source 22 can enter the light-guiding plate 21 through the light incidence face to thereby increase the brightness of the planar light source produced by the light-guiding plate 21 so as to alleviate a loss of the light rays, thus guaranteeing the light effect of the display module 2.

In order to further alleviate a loss of the light rays while the light-guiding plate 21 is fixed with the display panel 1, optionally the flexible printed circuit 3 is fixed on the surface of the light-guiding plate 21 away from the display panel 1 through a second light-shielding adhesive tape 6, and a second white screen-printed layer 8 is arranged on the side of the second light-shielding adhesive tape 6 facing the flexible printed circuit 3, as illustrated in FIG. 2.

In the display module above, the light source 22 is arranged on the flexible printed circuit 3, it is not necessary to arrange any lamp strip flexible printed circuit 3 in the backlight module 2, the light source 22 is powered directly by the flexible printed circuit 3 to thereby dispense with a process of soldering the lamp strip so as to further simplify the backlight module 2, the bent flexible printed circuit 3 can be bonded directly onto the light-guiding plate 21 of the backlight module 2 through the second light-shielding adhesive tape 6, and the light exit face of the light source 22 faces directly the light incidence face of the light-guiding plate 21, so that the light-guiding plate 21 is fixed with the display panel. In order to guarantee the light effect of the backlight module 2, the second white screen-printed layer 8 is arranged on the side of the second light-shielding adhesive tape 6 facing the flexible printed circuit 3, and the light rays, emitted by the light source 22, incident on the second light-shielding adhesive tape 6 can be reflected by the second white screen-printed layer 8 back to the light source 22 side, and in the meantime, the light rays entering the light-guiding plate 21 is reflected by the second white screen-printed layer 8 back into the light-guiding plate 21, that is, the second white screen-printed layer 8 will only reflect but not absorb the light rays emitted by the light source 22, so that as many light rays emitted by the light source 22 can enter the light-guiding plate 21 through the light incidence face to thereby increase the brightness of the planar light source produced by the light-guiding plate 21 so as to alleviate a loss of the light rays, thus guaranteeing the light effect of the display module 2.

In order to further alleviate a loss of light rays, optionally the backlight module 2 further includes a reflecting sheet 23, fixed on the side of the light-guiding plate 21 away from the display panel 1, and covered with the flexible printed circuit 3, as illustrated in FIG. 2.

In the display module above, the reflecting sheet 23 is fixed on the side of the light-guiding plate 21 away from the display panel 1, and covered with the bent flexible printed circuit 3, so that the light rays entering the light-guiding plate 21 are reflected by the reflecting sheet 23 and the flexible printed circuit 3 back into the light-guiding plate 21 to thereby increase the brightness of the planar light source produced by the light-guiding plate 21 so as to alleviate a loss of the light rays, thus guaranteeing the light effect of the display module 2.

In order to further improve the efficiency of light, the light source 22 is a COB light source in an optional implementation.

The COB light source is a highly light-efficient integrated planar light source formed of an LED chip bonded directly on a mirror metal substrate with a high reflectivity, is simple in structure, and has a low cost, and a light exit area and a formal size of the light source 22 can be designed for a formal structure of the product, so it is characterized by a stable electrical characteristic, scientific and reasonable circuitry, optical, and thermal dissipation designs, a high quality of lighting, high color rendering, uniform light-emission, no light spot, health- and environment-friendliness, easiness to install, convenience to use, a low maintenance cost, convenience to maintain, etc., as compared with an LED.

Figure 6:
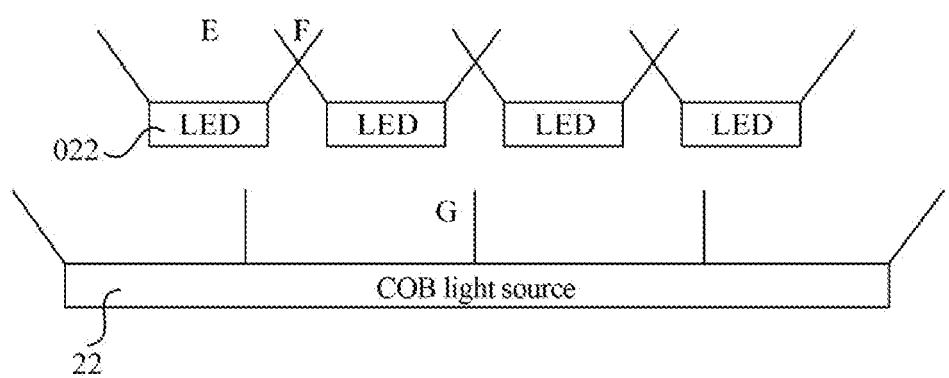
FIG. 6 is a schematic diagram of comparison between a light source in the display module according to the embodiment of the disclosure, and the light source in the display module in the related art.

As illustrated in FIG. 6, the light source 022 in the display module in the related art includes bright areas E and dark areas F produced by arranging LEDs at an interval, and the distance between the light source 22 and the display area C is so short that there are bright and dark areas; and the light source 22 in the display module above is a COB light source, and since the COB light source is structured in the form of emitting light in a planar pattern, there are only bright areas G, thus greatly improving the uniformity over an LED, and further shortening the distance between the light source 22 and the display area so as to reduce the size of the bezel, which can simplify the structure, and improve the efficiency of thermal dissipation of the light source 22. Accordingly the light efficiency can be improved, and the bezel can be narrowed, with the COB light source.

Figure 3:
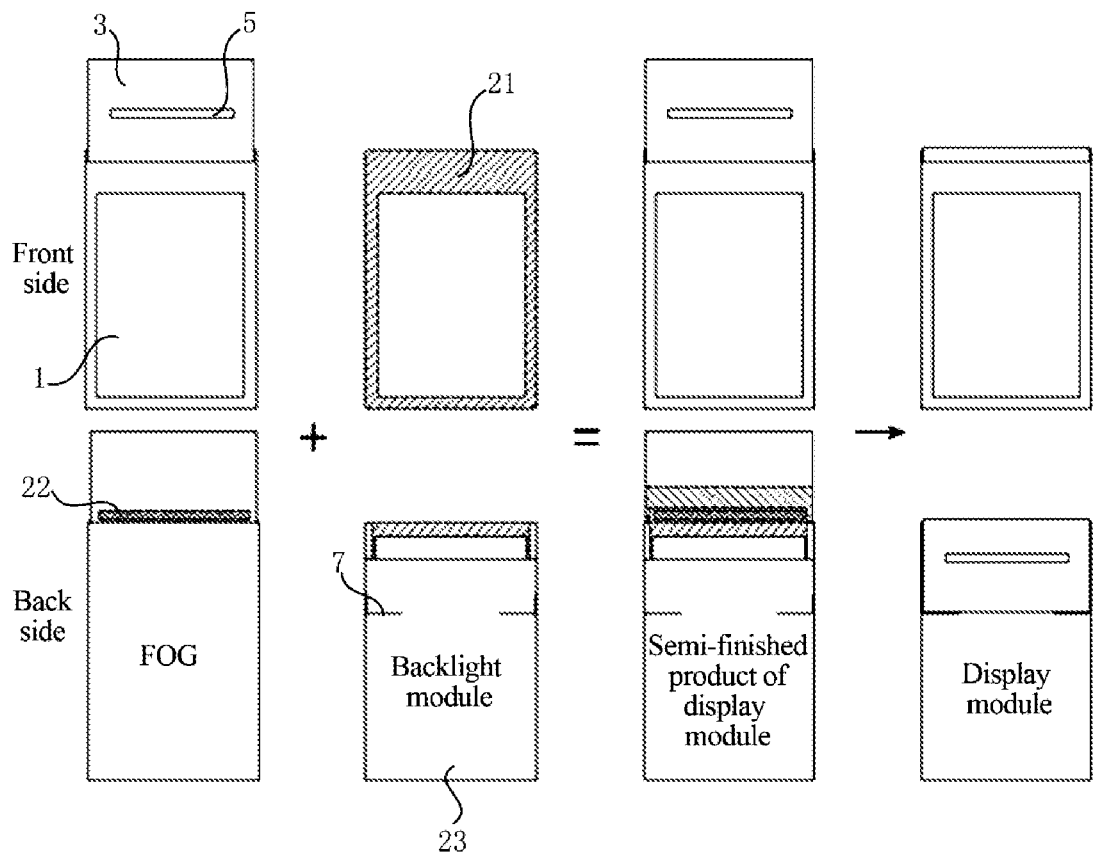
FIG. 3 is a sequence diagram of a process of a method for fabricating a display module according to an embodiment of the disclosure.
Figure 4:
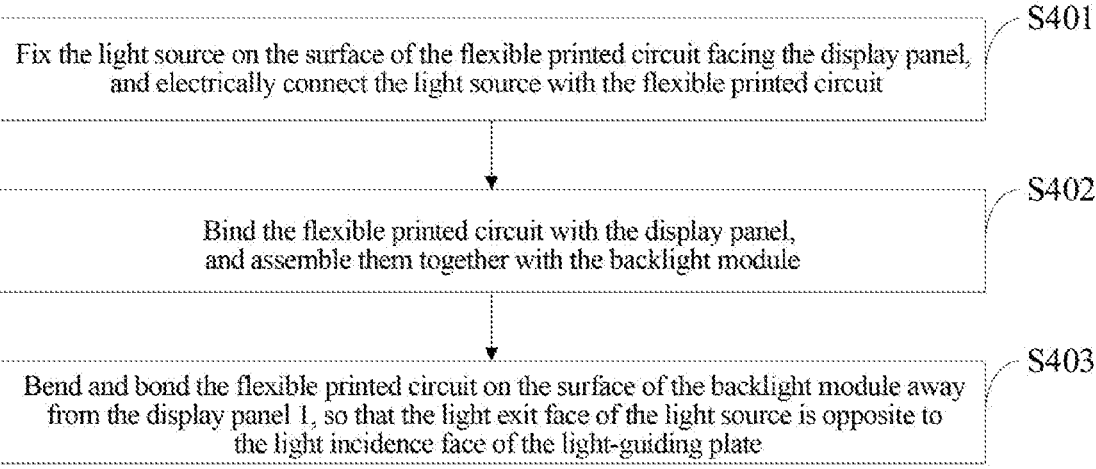
FIG. 4 is a flow chart of fabricating a display module according to an embodiment of the disclosure.

Furthermore as illustrated in FIG. 3 and FIG. 4, an embodiment of the disclosure further provides a method for fabricating the display module according to any one of the technical solutions above, where the method includes the following steps.

The step S401 is to fix the light source 22 on the surface of the flexible printed circuit 3 facing the display panel, and to electrically connect the light source 22 with the flexible printed circuit 3.

The step S402 is to bind the flexible printed circuit 3 with the display panel 1, and to assemble them together with the backlight module 2.

The step S403 is to bend and bond the flexible printed circuit 3 on the surface of the backlight module 2 away from the display panel 1, so that the light exit face of the light source 22 is opposite to the light incidence face of the light-guiding plate 21.

In the method above for fabricating a display module, after the IC 5 is fixed on the surface of the flexible printed circuit 3 away from the display panel 1, and electrically connected with the flexible printed circuit 3, the light source 22 is arranged directly on, and electrically connected, with the flexible printed circuit 3 in the step S402; next firstly the flexible printed circuit 3 and the display panel 1 are bound together into an FOG (a module into which the flexible printed circuit 3 and the display panel 1 are bound), and then the FOG and the backlight module 2 are assembled together into a semi-finished product of the display module, in the step 402; and lastly the semi-finished product of the display module is bent, and the flexible printed circuit 3 is bonded on the surface of the backlight module 2 away from the display panel 1, in the step S403, so that the light exit face of the light source 22 is opposite to the light incidence face of the light-guiding plate 21, thus resulting in the display module. The fabricating method above is simple in operation, and easy to perform.

Further to the fabricating method above, in order to improve the accuracy of bonding the bent flexible printed circuit 3, an alignment mark 7 is arranged on the reflecting sheet 23 of the backlight module 2 for the purpose of alignment while the flexible printed circuit 3 is being bonded on the surface of the backlight module 2 away from the display panel 1 in an optional implementation as illustrated in FIG. 3.

In the fabricating method above, the flexible printed circuit 3 is bonded on the surface of the backlight module 2 away from the display panel 1 by aligning the flexible printed circuit 3 with the alignment mark 7 arranged on the reflecting sheet 23 of the backlight module 2 so that the flexible printed circuit 3 is bonded accurately on the surface of the backlight module 2 away from the display panel 1.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A display module, comprising a display panel, a backlight module, and a flexible printed circuit, wherein the flexible printed circuit is electrically connected with the display panel, the backlight module comprises a light source, and the light source is fixed on a side of the flexible printed circuit facing the display panel, and electrically connected with the flexible printed circuit;

wherein the backlight module further comprises a light-guiding plate, a light exit face of the light source is opposite to a light incidence face of the light-guiding plate, and the light-guiding plate is fixed between a surface of the flexible printed circuit and a surface of the display panel; these surfaces are opposite to each other.

2. The display module according to claim 1, wherein the light source is soldered on the surface of the flexible printed circuit facing the display panel.

3. The display module according to claim 1, further comprises an IC fixed on a surface of the flexible printed circuit away from the display panel, and electrically connected with the flexible printed circuit.

4. The display module according to claim 1, wherein the light-guiding plate is fixed on the display panel through a first light-shielding adhesive tape.

5. The display module according to claim 4, wherein the first light-shielding adhesive tape covers the light-guiding plate, and a first white screen-printed layer is arranged on a side, of a portion of the light-shielding adhesive tape; the portion is beyond the light-guiding plate, the side of the portion faces the light source.

6. The display module according to claim 1, wherein the flexible printed circuit is fixed on a surface of the light-guiding plate away from the display panel through a second light-shielding adhesive tape, and a second white screen-printed layer is arranged on a side of the second light-shielding adhesive tape facing the flexible printed circuit.

7. The display module according to claim 6, wherein the backlight module further comprises a reflecting sheet, fixed on a side of the light-guiding plate away from the display panel, and partially covered with the flexible printed circuit.

8. The display module according to claim 1, wherein the light source is a COB light source.

9. The display module according to claim 1, wherein the flexible printed circuit is configured to power the display panel and the light source.

10. A method for fabricating the display module according to claim 1, the method comprising the steps of:
    fixing the light source on the surface of the flexible printed circuit facing the display panel, and electrically connecting the light source with the flexible printed circuit;
    binding the flexible printed circuit with the display panel, and assembling them together with the backlight module; and
    bending and bonding the flexible printed circuit on the surface of the backlight module away from the display panel so that a light exit face of the light source is opposite to a light incidence face of the light-guiding plate.

11. The fabricating method according to claim 10, wherein an alignment mark is arranged on a reflecting sheet of the backlight module for the purpose of alignment while the flexible printed circuit is being bonded on the surface of the backlight module away from the display panel.

\* \* \* \* \*